(12) United States Patent
Oberdoerster et al.

(10) Patent No.: US 8,717,485 B2
(45) Date of Patent: May 6, 2014

(54) PICTURE CAPTURING APPARATUS AND METHOD USING AN IMAGE SENSOR, AN OPTICAL ELEMENT, AND INTERPOLATION

(75) Inventors: Alexander Oberdoerster, Jena (DE); Andreas Brueckner, Jena (DE); Frank Wippermann, Meiningen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 278 days.

(21) Appl. No.: 13/098,208

(22) Filed: Apr. 29, 2011

(65) Prior Publication Data

US 2012/0013749 A1   Jan. 19, 2012

(30) Foreign Application Priority Data

Jul. 19, 2010   (DE) .......................... 10 2010 031 535

(51) Int. Cl.
    *H04N 5/225*   (2006.01)
    *G02B 27/10*   (2006.01)

(52) U.S. Cl.
    USPC .......................................... 348/340; 359/619

(58) Field of Classification Search
    USPC ....................................................... 348/340
    See application file for complete search history.

(56) References Cited

U.S. PATENT DOCUMENTS

| | | | |
|---|---|---|---|
| 5,822,125 A | 10/1998 | Meyers | |
| 7,009,652 B1 * | 3/2006 | Tanida et al. | 348/340 |
| 7,286,295 B1 * | 10/2007 | Sweatt et al. | 359/619 |
| 7,599,134 B2 * | 10/2009 | Bechtel et al. | 359/796 |
| 7,880,794 B2 * | 2/2011 | Yamagata et al. | 348/335 |
| 7,897,903 B2 * | 3/2011 | Duparre et al. | 250/208.1 |
| 8,085,312 B2 * | 12/2011 | Morita et al. | 348/222.1 |
| 8,237,841 B2 * | 8/2012 | Tanida et al. | 348/335 |
| 8,330,847 B2 * | 12/2012 | Yamada | 348/340 |
| 2006/0044451 A1 * | 3/2006 | Liang et al. | 348/340 |
| 2009/0050649 A1 | 2/2009 | Rushe et al. | |

(Continued)

FOREIGN PATENT DOCUMENTS

| | | |
|---|---|---|
| DE | 19755565 | 6/1998 |
| DE | 102004036469 | 2/2006 |

(Continued)

OTHER PUBLICATIONS

Bruckner, Andreas et al.; "Driving microoptical imaging systems towards miniature camera applications"; May 2010; SPIE Micro-Optics 2010, vol. 7716, 11 pages.

(Continued)

*Primary Examiner* — Ngoc-Yen Vu
(74) *Attorney, Agent, or Firm* — Perkins Coie LLP; Michael A. Glenn

(57) ABSTRACT

An improved ratio between hardware/manufacturing expenditure, on the one hand, and picture quality, on the other hand, when using a multi-channel optical element is achieved in that the samples of the pixels are arranged in accordance with an imaging direction from which the optical element images objects on the respective pixel, or with a lateral imaging position in a focal-depth area that is imaged to the respective pixel by the optical element, and when the distribution, thus arranged, of samples of the pixels is interpolated at intersection points of a regular grid extending over the entire distribution of the samples. In this manner, processing is standardized across the entire picture, so that transition problems between the subareas are avoided.

16 Claims, 10 Drawing Sheets

(56) References Cited

U.S. PATENT DOCUMENTS

| | | |
|---|---|---|
| 2009/0140131 A1 | 6/2009 | Utagawa |
| 2009/0179142 A1 | 7/2009 | Duparre et al. |
| 2009/0190024 A1 | 7/2009 | Hayasaka et al. |
| 2009/0245696 A1 | 10/2009 | Yuan et al. |
| 2010/0013857 A1 | 1/2010 | Fleet et al. |
| 2010/0026852 A1 | 2/2010 | Ng et al. |
| 2011/0228142 A1* | 9/2011 | Brueckner et al. ............ 348/241 |

FOREIGN PATENT DOCUMENTS

| | | |
|---|---|---|
| DE | 102006004802 | 8/2007 |
| EP | 0840502 A2 | 5/1998 |
| EP | 1912434 | 4/2008 |
| JP | 06-292050 | 10/1994 |
| JP | 2001-223931 | 8/2001 |
| JP | 2007-221423 | 8/2007 |
| JP | 2007-312314 | 11/2007 |
| JP | 2010-141381 | 6/2010 |
| WO | WO2005/069607 | 7/2005 |
| WO | WO2009/040110 | 4/2009 |
| WO | WO2009/151903 A3 | 12/2009 |

OTHER PUBLICATIONS

Kitamura, et al.; "Reconstruction of a high-resolution image on a compound-eye image-capturing system"; Mar. 10, 2004; Applied Optics, vol. 43, No. 8; pp. 1719-1727.

Choi, et al., "Super-resolution approach to overcome physical limitations of imaging sensors: an overview", Int'l Journal of Imaging Systems and Technology, vol. 14, No. 2, Wiley and Sons, NY, Jan. 2004, pp. 36-46.

Foote, et al., "FlyCam: practical panoramic video and automatic camera control", IEEE Conference on Multimedia and Expo, vol. 3, New York, NY, Jul. 30-Aug 2, 2000, pp. 1419-1422.

Li, et al., "Reconstruction of Bionic Compound Eye Images Based on Superresolution Algorithm", IEEE Int'l Conference on Integration Technology, Mar. 2007, pp. 706-710.

Vaish, et al., "Using plane + parallax for calibrating dense camera arrays", Proc. of the 2004 IEEE Computer Society Conference on Computer Vision and Pattern Recognition, Washington, DC, Jun. 2004, pp. 2-9.

* cited by examiner

PICTURE CAPTURING APPARATUS AND METHOD USING AN IMAGE SENSOR, AN OPTICAL ELEMENT, AND INTERPOLATION

CROSS-REFERENCE TO RELATED APPLICATIONS

This application claims priority to German Patent Application No. 102010031535.4 filed 19 Jul. 2010, which is incorporated herein by reference.

BACKGROUND OF THE INVENTION

The present invention relates to a picture capturing apparatus and to a method of capturing a picture.

Miniaturization of camera modules and reduction of their manufacturing cost is an important goal in many fields, such as the field of mobile phone cameras and the field of automotive engineering. In all dimensions, the module size is proportional to the pixel size. This also applies to the length along the optical axis: relatively small pixels reduce the sensor size for a given overall number of pixels; a relatively small sensor enables a shorter focal length with a given field of view. The minimum extension along the optical axis of a camera module is limited mainly by the focal length of the optical system.

Inspired by compound eyes of insects, multi-channel imaging systems promise progress in both aspects, namely miniaturization and cost reduction. Instead of a single stack of lenses with an extension in the order of magnitude of some millimeters, the optical system in multi-channel imaging systems consists of an array of microlenses. The micropictures generated by these microlens arrays are optically or electronically combined into a single picture. With a specific predefined field of view of the overall system, the focal length of the microlenses of such a multi-channel imaging system is only a fraction of the focal length of a single-channel system, whereby the design height along the optical axis is reduced, and the focal depth is significantly increased. Since each micropicture covers only a small portion of the field of view, the optical systems may be configured to be simple: frequently, a lens and a few apertures per channel are sufficient. Since the microlenses have diameters in the order of magnitude of hundreds of micrometers, and a vertex height in the range of several 10 micrometers, they may be produced cost-effectively in a wafer bond arrangement and with a high precision.

However, so far it has been a challenge to achieve sufficient resolutions for applications such as for cameras, mobile phones or the like. In spite of the relatively axially parallel optical path of each individual channel, optical distortions occur for each channel, which complicates stitching together of the individual partial pictures on the individual imaging channels. If the attempt is made to mutually align microlens arrays and associated subareas of the image sensor with such precision that the frame arrays of the subareas of the image sensor need only be stitched together to form an overall pixel array, this has meant large requirements placed upon manufacturing tolerances and upon tolerances in the assembly of image sensor and microlens array. In Brückner, Duparré, Dannberg, Leitel and Bräuer: "Driving Microoptical Image System towards Miniature Camera Applications, Micro-Optic 2010, Proceedings of SPIE, vol. 7716, an algorithm for combining partial pictures of a multi-channel imaging system to form an overall picture is described, which is effected in several stages: The micropictures are initially inverted and subsequently equalized, whereupon the micropictures are joined together to form an overall picture by being resorted while taking into account the parallax. Equalization is performed with subpixel accuracy. The individual pixel clouds thus obtained are subject to interpolation so as to create partial pictures that are equalized in each case and wherein the picture information is specified to integer pixel positions. Said partial pictures are finally interwoven to form an overall picture by rearranging the pixels or by interleaving the pixels in the overlap areas of the equalized partial pictures. Even though the approach disclosed there reduces the above problem of the large requirements placed on the manufacturing accuracies, there remains the problem that due to mismatches of individual processing of the partial pictures, artifacts may arise in the overall picture produced, in particular along the overlap areas of the partial pictures.

Problems of a similar kind as were described above with reference to the multi-channel imaging systems for achieving a larger overall field of view also occur in other applications. US 2010/0013807 A1 entitled "Scene Independent Method for Image Formation in Lenslet Array Imagers" describes, e.g., an array of microlenses wherein the lenses have to face more or less the same direction and have to have the same image aperture angle. The viewing directions of the individual microlenses differ only to a very small extent, however. In particular, the patent describes how the differences in the viewing directions of the individual partial pictures may be determined. In this respect, a description is given, inter alia, of how the partial pictures may be placed one upon the other very accurately, said patent using a global shift. However, potential distortion of the frames is not compensated for.

SUMMARY

According to an embodiment, a picture capturing apparatus may have: an image sensor including a multitude of pixels, said image sensor being configured to detect, in a photograph, a sample per pixel; an optical element for producing optical imaging to the image sensor, the optical element including a multi-channel optical element for individually imaging overlapping solid-angle ranges to separate subareas of the image sensor, and wherein each pixel of the image sensor has an imaging value associated therewith, the imaging values being imaging directions from which the optical element images objects to the respective pixel, or lateral imaging positions within a focal-depth area that is imaged to the respective pixel by the optical element; and an interpolator for interpolating a distribution of the samples of the pixels in accordance with their imaging values at intersection points of a regular grid that extends across the entire distribution of the samples in order to achieve an array of picture values.

According to another embodiment, a method of capturing a picture by means of an image sensor including a multitude of pixels, said image sensor being configured to detect, in a photograph, a sample per pixel, and an optical element for creating optical imaging to the image sensor, the optical element including a multi-channel optical element for individually imaging overlapping solid-angle ranges to separate subareas of the image sensor may have the steps of associating an imaging value with each pixel of the image sensor, the imaging values being imaging directions from which the optical element images objects to the respective pixel, or lateral imaging positions in a focal-depth area that is imaged to the respective pixel by the optical element; and interpolating a distribution of the samples of the pixels in accordance with their imaging values at intersection points of a regular grid extending across the entire distribution of the samples so as to achieve an array of picture values.

According to another embodiment, a computer program including a program code for performing the method of capturing a picture by means of an image sensor including a multitude of pixels, said image sensor being configured to detect, in a photograph, a sample per pixel, and an optical element for creating optical imaging to the image sensor, the optical element including a multi-channel optical element for individually imaging overlapping solid-angle ranges to separate subareas of the image sensor, which method may have the steps of: associating an imaging value with each pixel of the image sensor, the imaging values being imaging directions from which the optical element images objects to the respective pixel, or lateral imaging positions in a focal-depth area that is imaged to the respective pixel by the optical element; and interpolating a distribution of the samples of the pixels in accordance with their imaging values at intersection points of a regular grid extending across the entire distribution of the samples so as to achieve an array of picture values, when the program runs on a computer.

In accordance with an embodiment of the present invention, a picture capturing apparatus comprises an image sensor having a plurality of pixels and being configured to detect, in a photograph, one sample per pixel, and an optical element for creating an optical image on the image sensor, the optical element comprising a multi-channel optical element for individually forming overlapping solid-angle ranges to separate subareas of the image sensor. Each pixel of the image sensor has an imaging value associated with it, and the imaging values are imaging directions from which the optical element images objects to the respective pixel, or lateral imaging positions in a focal-depth area that is imaged to the respective pixel by the optical element. Finally, the picture capturing apparatus comprises an interpolator for interpolating a distribution of the samples of the pixels in accordance with their imaging values at points of intersection of a regular grid extending over the entire distribution of the samples so as to obtain an array of picture values.

A finding of the present invention consists in having recognized that an improved ratio between hardware/manufacturing expenditure, on the one hand, and picture quality, on the other hand, when using a multi-channel optical element may be achieved when the samples of the pixels are arranged in accordance with an imaging direction from which the optical element images objects on the respective pixel, or with a lateral imaging position in a focal-depth area that is imaged to the respective pixel by the optical element, and when the distribution, thus arranged, of samples of the pixels is interpolated at intersection points of a regular grid extending over the entire distribution of the samples. In this manner, processing is standardized across the entire picture, so that transition problems between the subareas are avoided.

BRIEF DESCRIPTION OF THE DRAWINGS

Implementations of the present application are the subject matter of the dependent claims.

Embodiments of the present invention will be detailed subsequently referring to the appended drawings, in which.

DETAILED DESCRIPTION OF THE INVENTION

Figure 1:
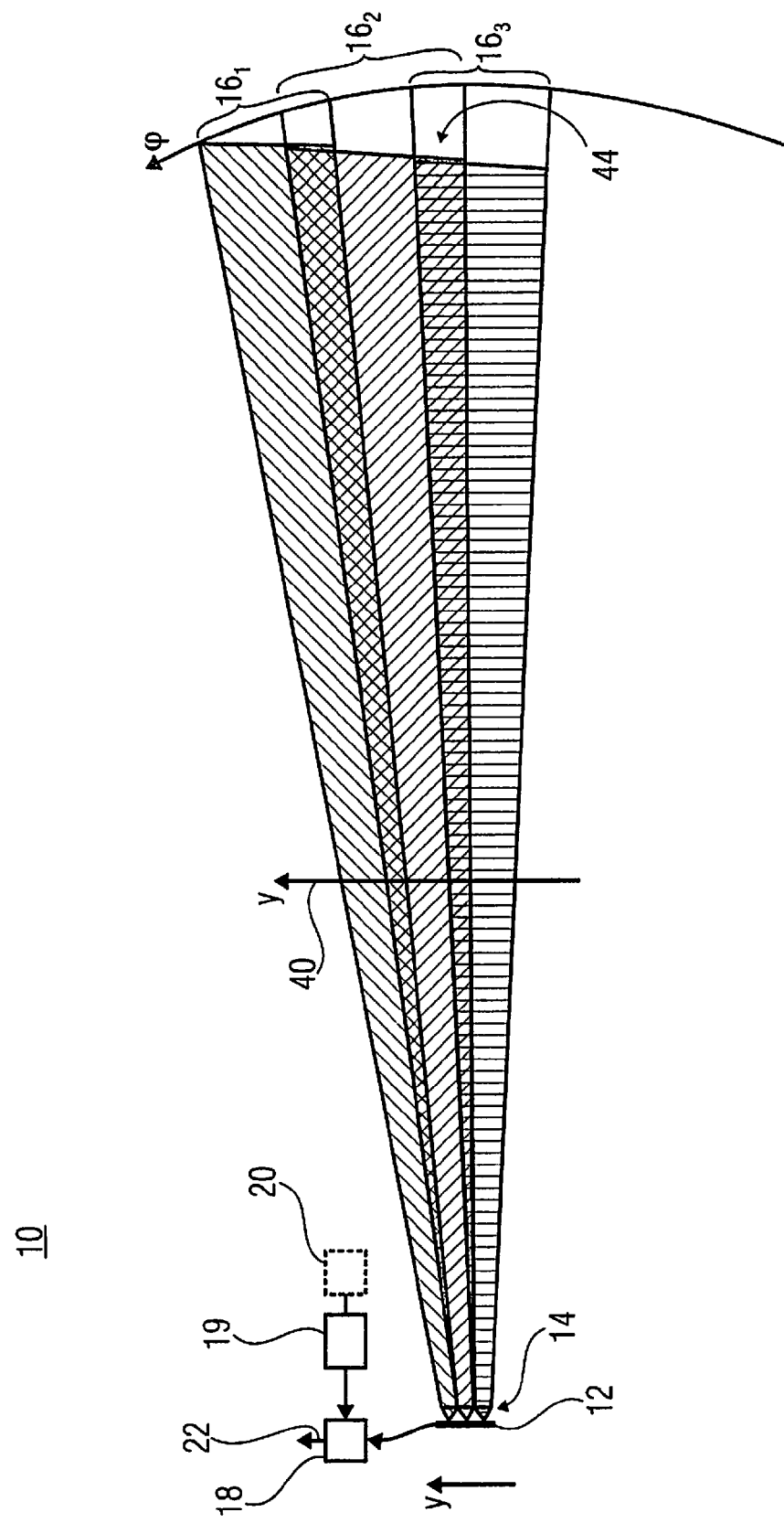
FIG. 1 shows a schematic representation of a picture capturing apparatus in accordance with an embodiment of the present application.

FIG. 1 shows a picture capturing apparatus in accordance with an embodiment of the present application. The picture capturing apparatus of FIG. 1 is generally indicated by reference numeral 10 and comprises an image sensor 12 having a multitude of pixels not shown, by way of example, until FIG. 2, and an optical element 14 for generating an optical image on the image sensor 12, the optical element comprising a multi-channel optical element for individually imaging overlapping solid-angle ranges $16_1$, $16_2$ and $16_3$ to separate subareas of the image sensor, the latter ones of which are also not depicted until FIG. 2. The picture capturing apparatus 10 of FIG. 1 further comprises an interpolator 18 and—optionally—further components such as an associator 19 and a user input interface and/or a rangefinder 20.

The image sensor 12 is connected to the interpolator 18 and is configured to detect in a photograph a sample, such as a brightness value, per pixel, and to output same to the interpolator 18. The optional input interface and/or the optional rangefinder 20 are optionally connected to the interpolator 18 via the associator. As will be explained in more detail below, it is possible via the optional input interface or the rangefinder 20 in cooperation with the associator 19 that the interpolator 18 may take into account, in the interpolation that will be explained below in more detail, the distance exhibited by the objects of a scene that are located within the overall field of view formed by the overlapping solid-angle ranges $16_1$-$16_3$, and are imaged to the respective subareas of the image sensor 12. The interpolator 18 outputs the desired picture in the form of an array of picture values at an output 22 of the picture capturing apparatus 10.

Since the design of the picture capturing apparatus of FIG. 1 was described above, its mode of operation will be described in more detail below. Reference shall also be made sometimes to FIG. 2, which shows the same components as FIG. 1, but with a higher level of detail in accordance with an embodiment of the present application.

Figure 2:
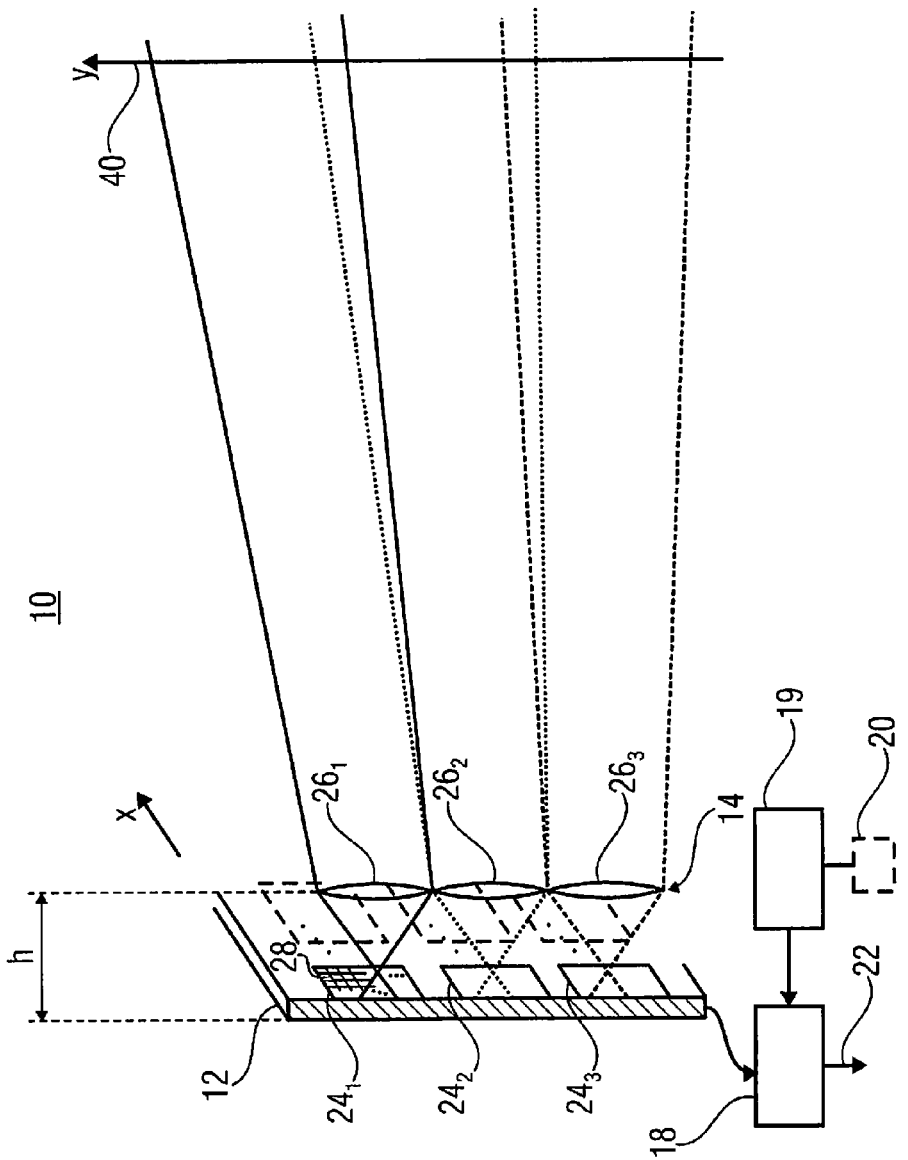
FIG. 2 shows a schematic representation of a picture capturing apparatus in accordance with a further, slightly more detailed embodiment of the present application.

As was already mentioned above, the optical element 14 has a multi-channel optical element for individually imaging overlapping solid-angle ranges $16_1$-$16_3$ to separate subareas $24_1$-$24_3$ or $24_3$ of the image sensor 12. As is indicated in FIGS. 1 and 2, the multi-channel optical element may be a lens array of microlenses $26_1$-$26_3$, each of which is associated with a respective one of the subareas $24_1$-$24_2$ or $23_3$ so as to form a corresponding channel having a respective field of view, or solid-angle range $16_1$-$16_2$ or $16_3$. In the exemplary case of FIGS. 1 and 2, the multi-channel optical element is configured such that the overlapping solid-angle ranges $16_1$-$16_3$ together cover an overall solid-angle range that is clearly larger than the mutually overlapping solid-angle ranges seen individually, such as 4 times larger than each of the overlapping solid-angle ranges $16_1$-$16_3$. As was already mentioned in the introduction to the description of the present application, a design height h, which essentially corresponds to a distance of the optical element 14 from the image sensor 12 and is equal to or slightly larger than a focal length of the microlenses, may thereby be reduced. The overall viewing angle, which as a whole is enlarged, specifically is achieved in that a center-to-center distance of the microlenses $26_1$-$26_3$ or an average distance of the vertices of the microlenses $26_1$-$26_3$ is enlarged as compared to a center-to-center distance, or repeat distance of the subareas $24_1$-$24_3$ of the image sensor 12. In this manner, the desired overall range of vision of the picture capturing apparatus is decoupled from the design height h. In other words, due to the subdivision of the overall range of vision into the individual ranges of vision $16_1$-$16_3$, the design height h may be reduced as compared to a design having an individual optical element, and the amount of reduction of the design height h increases as the number of subareas increases. Due to the required distance between the lenses or the size of the lenses in relation to the smaller subareas, the subdivision into individual channels may be limited, however, in reality. For example, a number of channels ranges from 4 to 10000.

Before the mode of operation will be described, it shall finally be pointed out that unlike the scenario depicted in the next embodiments, it would also be possible to set the repeat distance of the microlenses $26_1$-$26_3$ to be smaller than the average repeat distance of the subareas $24_1$-$24_3$, namely such that the solid-angle ranges essentially completely overlap. For example, the overall solid-angle range could be so small that it is 120% larger, at the most, than any of the overlapping individual solid-angle ranges.

As has already been mentioned, the image sensor 12 has a multitude of pixels 28. In particular, each of the subareas $24_1$-$24_3$ comprises a multitude of said pixels 28. For example, each subarea $24_1$-$24_3$ comprises 32 or more pixels. As will be described in more detail later on with reference to FIG. 4, the image sensor 12 may be a one-substrate image sensor, for example, wherein the subareas $24_1$-$24_3$ are formed in combination, wherein gaps between said subareas $24_1$-$24_3$ may be used for accommodating control circuit parts for controlling the photosensitive areas of the pixels 28, such as read amplifiers, row and/or column decoders, etc.

Figure 3A:
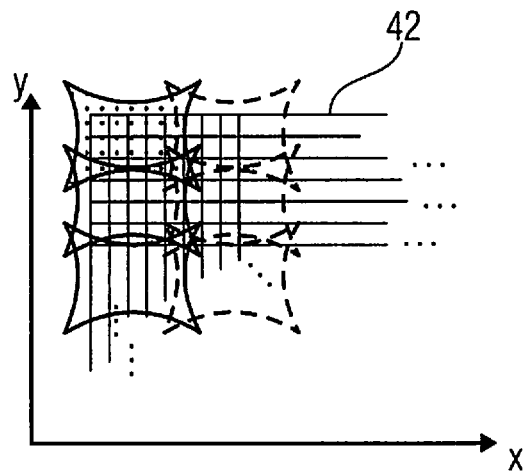
FIG. 3a shows a schematic representation of a distribution of the pixels in accordance with their imaging values in accordance with an embodiment of the present application, wherein lateral imaging locations in a focal-depth area are used as the imaging values.
Figure 3B:
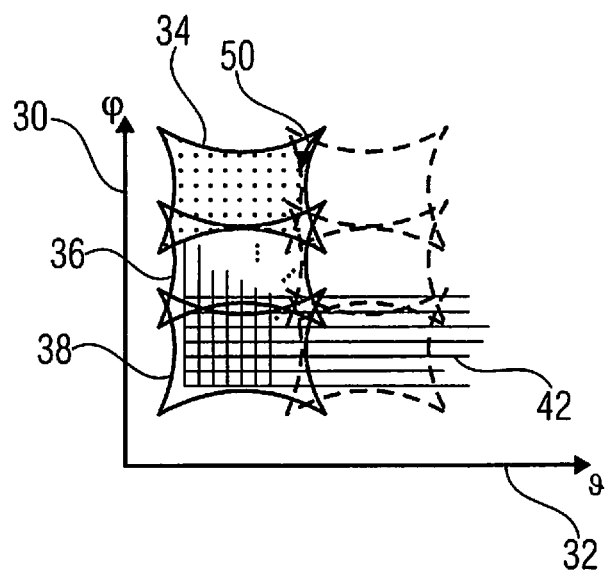
FIG. 3b shows a schematic representation of a distribution of the pixels in accordance with an embodiment of the present invention, according to which the imaging values used are imaging directions along which the optical element performs imaging to the respective pixels.

Just like a respective solid-angle range $16_1$-$16_3$ is associated with the subareas $24_1$-$24_3$ by the arrangement relative to the optical element 14 and, in particular, to the microlenses $26_1$-$26_3$, each pixel 28 naturally also has a respective solid-angle range, which evidently is smaller, and, thus, a viewing and/or imaging direction associated with it, said direction e.g. extending centrally to the respective solid-angle range of the pixel. The connection will be explained later on in more detail with reference to FIGS. 5a and 5b. All of the imaging and/or viewing angles of the imaging and/or viewing directions are determined, for example, in relation to an optical axis of the optical element 14 or a surface normal of the photosensitive surface area of the image sensor 12. In this manner, it is possible to arrange the pixels 28 within a plane as is depicted in FIG. 3b, namely a plane spanned by two axes, of which an axis 30 enters the deviation of the imaging direction of the respective pixel $\phi$ in a row direction x of the pixels 28, and an axis 32 enters e.g. the angular deviation of the imaging direction in relation to the optical axis in the column direction y perpendicular to the axis x, the latter angle being indicated by $\theta$. It shall be pointed out that the axes are advantageously identically scaled or isotropic. FIG. 3b indicates how the pixels are arranged within the plane thus spanned in accordance with their imaging directions. The border 34 surrounds, e.g., the positions, indicated by dots, of the pixels 28 of the subarea $24_1$. The cushion-like look of the border 34 indicates that a distortion of the microlens $26_1$ leads to a cushion-shaped distribution of the pixels 28 of the subarea $24_1$ within the ($\phi$, $\theta$) plane. For clarity's sake, FIG. 3b does not depict the pixels 28 of the other subareas $24_2$-$24_3$, but only their borders 36 and 38, which the edges of respective partial pixel dot clouds. In addition, FIG. 3b indicates the locations of the pixels of subareas which may be positioned, for example, in the x direction, adjacent to the subareas $24_1$-$24_3$, and are indicated by dashed lines in FIG. 2.

If the scene captured by the picture capturing apparatus 10 is sufficiently distant, it will suffice, as was described above, to only contemplate the viewing direction associated with each pixel 28. Parallax effects that occur due to the fact that the picture areas $24_1$-$24_3$ and the associated microlenses are mutually laterally offset, carry no weight in case of large distances. This is different for shorter distances. For example, FIG. 1 shows a focal-depth area 40 as a plane extending perpendicularly to the optical axis of the optical element 14, just like FIG. 2 shows this focal-depth area. It shall once again be pointed out that due to the fact that the scene captured is subdivided into several channels, the focal depth of the optical element 14 is very high. In this manner, it is possible for the microlenses $26_1$-$26_3$ to image objects within a very large focal-depth range, i.e. within a very large range of distances from the optical element 14, to the image sensor 12 in a sharp manner. For example, microlenses $26_1$-$26_3$ may be positioned at such a distance from the photosensitive area of the image sensor 12 that this distance is either equal to or slightly larger than a focal length of the microlenses $26_1$-$26_3$.

Just like each pixel 28 may have an imaging direction associated with it, each pixel may also have a lateral imaging position in the transversally extending focal-depth area 40 associated with it, namely that which is imaged to the respective pixel 28 by the optical element 14. As is shown in FIG. 3a, the pixels 28 may be arranged, in accordance with their lateral imaging positions, within a plane that is spanned by a Cartesian coordinate in the direction x and by a Cartesian coordinate in the direction y. As in the case of FIG. 3b, FIG. 3a only indicates, by means of dots, the positions of the pixels 28 for the subareas $24_1$ individually, whereas continuous lines globally indicate the position and/or extension of the cloud of positions of the pixels of the subarea $24_2$-$24_3$, and dashed lines indicate a position of the pixels of potential further subareas that are indicated by dashed lines in FIG. 2. In FIG. 3a, too, a cushion-shaped implementation of the border lines indicates that the single-channel optical elements of the optical element 14 may cause distortions.

As was mentioned above, the image sensor 12 and the optical element 14 are arranged at a fixed distance from each other. Naturally, a possibility of variably adjusting the distance between the image sensor 12 and the optical element 14 would also be possible in order to be able to adjust the focal-depth range, but as was mentioned above, due to the utilization of the multi-channel optical element and the apertures—reduced in size—of the microlenses, the focal-depth range is anyway large enough that readjustment is not necessary in most cases. If the picture capturing apparatus 10 is designed to capture pictures of objects arranged at distances for which the parallax effects are not an issue yet, it will be possible that the association, depicted in FIG. 3b, of the imaging directions with the individual pixels 28 of the subareas $24_1$-$24_3$ is fixed. In this case, it would not be absolutely necessary for the associator 19 to be there. Rather, the association might be fixedly programmed within the program code implementing the function of the interpolator 18, or might be hardwired. Alternatively, the associator 19 might be present as a memory in the form of a look-up table. Implementation of the associator 19 as an arithmetic unit which recalculates the imaging directions of the individual pixels 28 for each photograph would also be possible.

Naturally, it would also be possible for the picture capturing apparatus 10 of FIG. 1 to be adapted to only capture objects within a specific close range, such as a close range of approximately half a meter. In this case, the previously mentioned association in accordance with FIG. 3a might be fixedly mounted within the interpolator 18, and the associator 19 might be missing. Alternatives as were described above in relation to the association of FIG. 3b would naturally also be possible, however.

The associations in accordance with FIGS. 3b and 3a might be determined—following assembly of the picture capturing apparatus—by means of capturing suitable calibration objects, for example. Alternatively, determination of the association of imaging direction and/or lateral imaging position in the focal-depth area 40 might be determined by means of calculation using the design parameters of the picture capturing apparatus 10 and/or, in particular, of the image sensor 12 of the optical element 14 and their mutual relative positions. For both alternatives, it would be possible to also take into account the distortions caused by the optical element 14.

Of course, it would also be possible that the picture capturing apparatus 10 be provided both for photographs wherein parallax effects play a part due to the lateral offset between the subareas or apertures, and for photographs wherein this is not the case. In this case, the user input interface 20 might be used by a user to specify to the associator 19 whether the association is to be performed in accordance with FIG. 3b, i.e. for long-distance shots, or in accordance with FIG. 3a, i.e. for close-up shots. A specification by a rangefinder 20 would also be possible, said rangefinder being able to determine the distance by means of run-time measurement or the like or by analyzing the information itself that is present in the subareas, such as correlation. The transition between the associations in accordance with FIGS. 3b and 3a need not be abrupt. Rather, the parallax term anyway disappears continuously as the distance of the scene from the optical element 14 increases. Thus, it would also be possible for the associator 19 to obtain an indication of the distance of the object to be captured from the input interface/the rangefinder 20, and to adjust the association accordingly while taking into account the parallax term by looking up by means of the indication of the distance or by calculating while using the indication of the distance.

The interpolator 18 serves to produce an array of pixels, i.e. a regular grid of picture values, i.e. the desired picture, from the common dot cloud of all of the pixels 28 within the plane in accordance with FIG. 3b and/or FIG. 3a. To this end, the interpolator 18 superimposes a regular grid 42 over the combination of all of the individual dot clouds of the subareas, i.e. over the overall frames with the pixels being arranged in accordance with imaging values, and interpolates between the samples of the pixels at the positions within the plane in accordance with FIG. 3a or FIG. 3b, namely at the positions of the intersection points of the regular grid 42. It shall be pointed out that it is possible for the regular grid to have more intersection points than nodes, i.e. more intersection points than pixels 28. However, the intersection points of the regular grid 42 that contribute to the desired picture array should be within the shared quantity of all of the pixels, since otherwise an extrapolation including the inaccuracy associated therewith may be used. An example of an interpolation method will be provided below. However, there are a multitude of possible interpolation methods that may be employed. Anyway, the imaging values may advantageously exist in a scalar accuracy with a smallest unit being at least 16 times larger than a grid spacing of the regular grid. In other words, the interpolator 18 within the room in accordance with FIG. 3a or 3b may handle the components occurring there with a first bit accuracy, and in relation to same, the intersection points of the grid 42 have a distance of at least 16 smallest units. Thus, the interpolation may occur for all of the frames in one step and in a uniform manner, which may be reflected by the fact that, for example, even in the overlap areas of the frames or individual pixel dot clouds, only one interpolation is performed per grid point, and that all of the frames that overlap within the respective overlap area equally participate in said interpolation. Readjusting or manipulating the imaging values is not necessary. Once they have been determined, they are taken into account, e.g., only in weighting values with which the beam density values of the pixels are combined into a respective interpolated value, specifically in that, as will be illustrated below, the weighting is, e.g., equal to a suitable measure of distance between the contemplated intersection grid point at which interpolation is to currently take place and the respective surrounding pixel.

The above description did not address the possibility that the pixels 28 possibly exhibit different sensitivity behaviors. Their sensitivities may differ, e.g., spectrally, with regard to polarization of the incident light, or with regard to the (neutral density) sensitivity. In this case it would be possible for the interpolator 18 to arrange the pixels of identical sensitivity characteristics, as was described above, within the planes in accordance with FIG. 3a and/or 3b, and to individually superimpose the grid 42 over same in order to obtain a regular picture array separately for this sensitivity characteristic; this approach would then be performed for all of the sensitivity characteristics, and/or for the pixels all of the sensitivity characteristics separately for each sensitivity characteristic. As will be explained below, it is possible in this case that the interpolation of the respective partial distribution of pixels of identical sensitivity characteristic may be improved in that the pixels having different sensitivity characteristic are also taken into account. In this manner that has just been described, it would be possible to obtain a color picture. An advantage of this approach consists in that the grid 42 may be located at precisely the same position for all of the sensitivity characteristics within the plane in accordance with FIG. 3a and/or FIG. 3b, so that all of the color components for a position of the shared color picture array refer to precisely the same location. With normal color photographs taken with a color picture sensor this is not the case, since the components of a subpixel cell are laterally sampled at different locations. In the subareas $24_1$-$24_3$ of the picture capturing apparatus 10 this is also the case, but by means of the interpolation, the pixel dot subclouds of the individual sensitivity characteristics are interpolated at exactly the same position. If, as has just been mentioned, the pixels of the other sensitivity characteristics are also additionally used in order to improve interpolation, an even better picture quality will result.

However, it is also possible that in the picture capturing apparatus 10, each channel seen individually is uniformly filtered, e.g. spectrally filtered, neutral-density filtered, or polarization filtered, but different channels may have different filter characteristics. In this case, the solid-angle ranges might be provided such that for each filter characteristic, the channels belonging to this filter characteristic cover the overall field of view of the picture capturing apparatus 10, so that for all of these filter characteristics, an overall picture cloud in accordance with FIG. 3a and/or 3b results. Again, the interpolator 18 in this case may separately perform, for each of these pixel dot subclouds for the different filter characteristics, an interpolation at the grid intersection points of the regular grid 42 in order to obtain, in this manner, a regular picture array comprising multi-component picture information, such as a color picture.

Now that the mode of operation and the architecture of embodiments in accordance with the present application have been roughly described, possibilities of configuring the individual components mentioned above will be addressed below. As will be seen from the following description, the image sensor 12 may be a CMOS image sensor, for example, wherein the subareas $24_1$-$24_3$ are jointly integrated on a substrate or chip. By means of wafer bonding or molding, the multi-channel optical element may be directly integrated on the chip itself, or separately from a surface of the substrate by means of semitransparent layer arrangements which ensure optical transparency between the subareas $24_1$-$24_3$ and the aperture, but ensure optical mutual separation of the individual channels.

The interpolator 18 might be integrated on the same chip and substrate that also has the image sensor 12 integrated thereon. The interpolator 18 might be hardwired, might be a programmable circuit logic or a computer program running on a processor. In particular, however, the interpolator 18 may also be a computer that is connected to the image sensor 12.

The associator 19 may be a non-volatile memory, for example, e.g. an EEPROM or the like. The picture input interface 20 may be a toggle switch, for example, having a first toggled position, a second toggled position, and a non-toggled position; the first two positions might trigger a long-distance shot or a close-up shot, and the last-mentioned position would be an idle or don't-care state. Depending on the actuating position, the associator 19 would perform the association in accordance with FIG. 3b or 3a, for example. However, it would also be possible that the user input interface 20 is a rotating wheel on any other continuously variable user interface, such as an adjustable bar in a graphic user interface. In the last-mentioned case, the associator 19 might also use the input made as a continuous or quasi-continuous indication of the distance so as to use same for calculating the association of the lateral imaging positions in the focal-depth area 40.

As was also mentioned above, however, a distance sensor 20 may also be used. This distance sensor may detect the distance of the scene to be captured in any manner, such as by run-time measurement or the like, but also by estimation, for example from the picture information of the individual partial pictures themselves. The distance measurement thus obtained might be used, in a more or less quantized state, by the associator 19, as was mentioned above, for adjusting the association specification accordingly.

Now that some embodiments of the present application have already been described above, some implementation details will be provided below that might possibly be used for implementing above embodiments.

In this context, what was described above will initially be repeated in other words. As has been described above, the optical element 14 produces, e.g., M×N non-overlapping micropictures on the sensor 12. The individual channels of the microchannel optical element may comprise, e.g., individual microlenses $26_1$-$26_3$. Each microlens images a solid-angle range $16_1$-$16_3$ from the object room to the sensor; as was already indicated above and will be detailed below, this simplification only applying to objects whose distance is large as compared to the microlens repeat distance. The solid-angle ranges $16_1$-$16_3$, or fields of view, of the individual channels are not disjoint, but overlap one another, as is shown at 44 in FIG. 1.

Figure 5A:
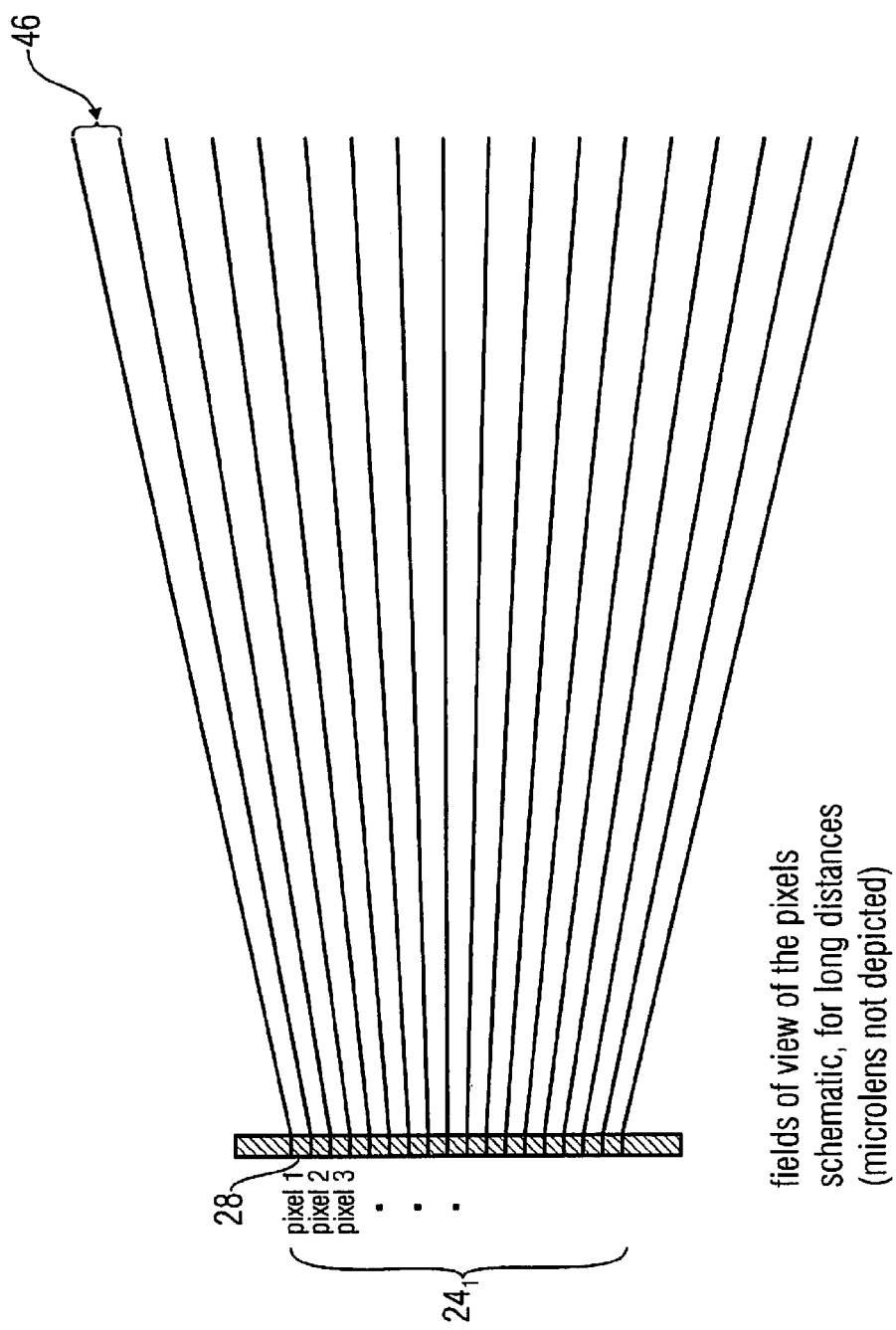
FIGS. 5a and 5b show schematic representations for illustrating the fields of view and viewing directions of individual pixels.
Figure 5B:
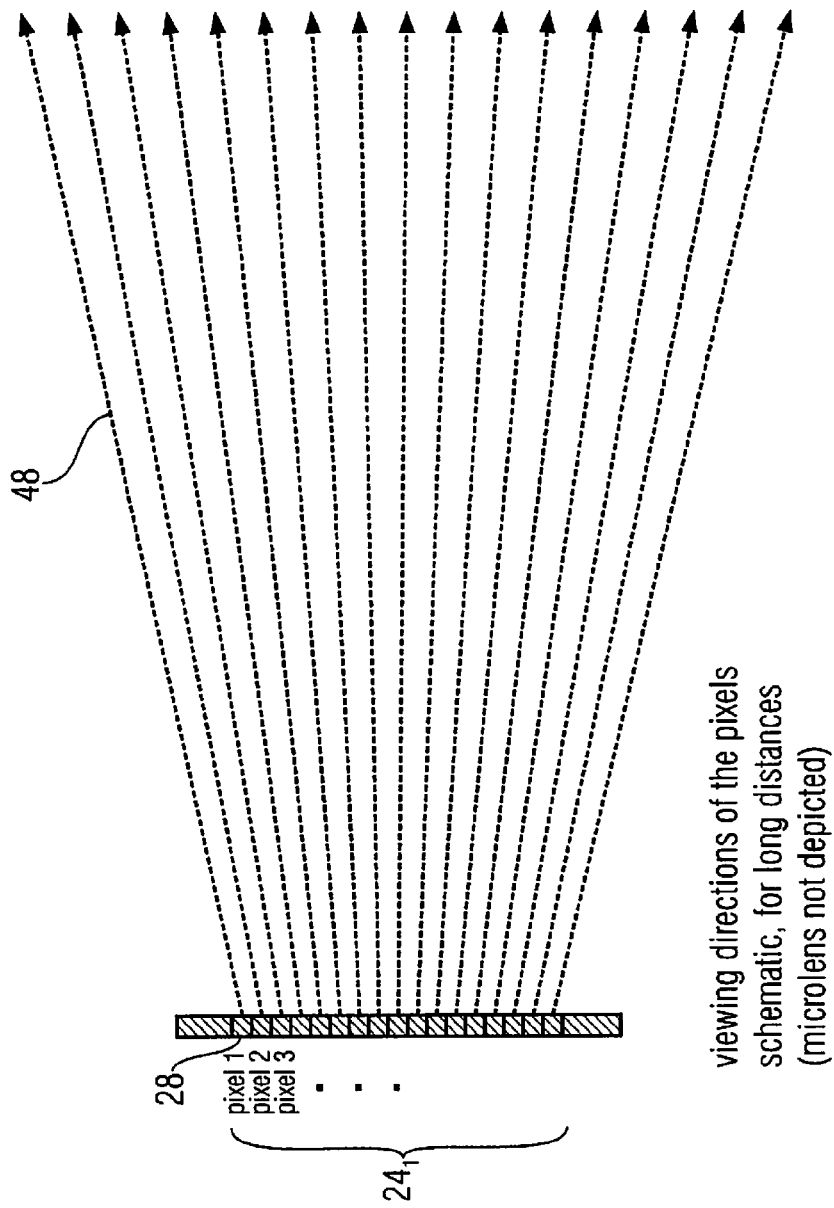

Each pixel 28 within a micropicture $24_1$-$24_3$, said micropicture in turn being located within the area illuminated by the associated microlens $26_1$-$26_3$, "sees" a small solid angle at which integrates over same. FIG. 5a exemplarily provides a highly simplified illustration of this regarding subarea $24_1$. The solid angles 46 which see a single one of the mutually adjacent pixels 28 within a subarea $24_1$ of a microlens—which is not shown in FIG. 5a for clarity's sake—abut one another without any gaps. Of course, it is possible that due to a limited filling factor of the pixels 28, the areas 46 do not abut one another without any gaps. However, to simplify things, it may be assumed that the value of a pixel 28 represents a measured value of the radiance that incides on the respective pixel 28 in the direction of the beam at the center of the respective solid angle 46. This then represents the above-mentioned viewing direction 48 of the respective pixel 28 and is illustrated in FIG. 5b.

Figure 6:
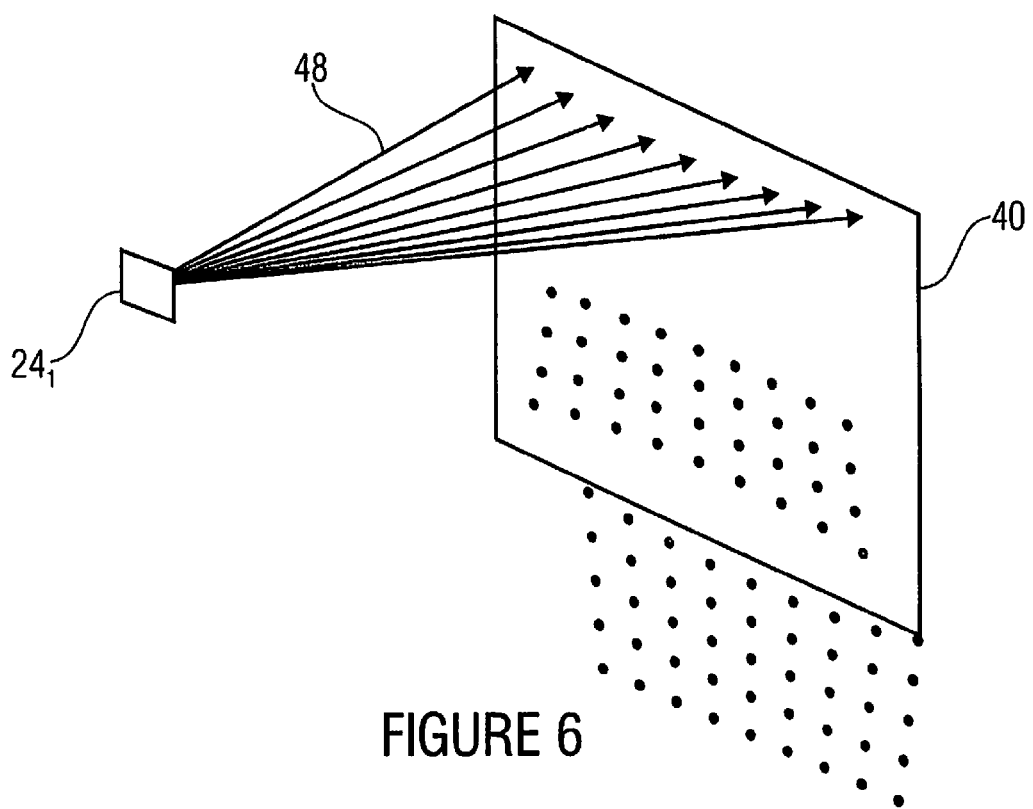
FIG. 6 shows a spatial view for illustrating viewing directions of the pixels within a subarea including a distortion in accordance with an embodiment.

To reduce manufacturing costs, it may be possible that the microlenses are not free from distortion. Therefore, the pixels do not scan the space in an uniform manner in accordance with FIG. 3a and/or 3b; the grid formed from the viewing directions of the pixels in FIG. 3b is therefore not regular, for example. In addition, each microlens $26_1$-$26_3$ of the multi-channel optical element may have its own form of distortion, which is shown by way of example for the channel of the area $24_1$ in FIG. 6.

As was described above, however, it is possible for the picture capturing apparatus 10 to produce a regular, pleasing shared picture from the micropictures.

The measured values, i.e. the samples of the individual pixels 28, of the radiances from the pixels are plotted in a plane in accordance with FIG. 3a or 3b. The coordinates of the measured values result, for example, from the viewing direction or the direction of the optical axis of the associated microlens $26_1$-$26_3$, or of the respective channel, from the pixel coordinates of the respective pixel beneath the respective microlens, and from the distortion of the respective microlens, and may be indicated in angular units or in a Cartesian plot in relation to a focal-depth plane. The precise shape of the distortion may be determined from the optics design of the optical element 14, but may also be measured for a specific physical system consisting of the sensor 12, and, e.g., the glued optical element 14.

In this manner, each microlens or each subarea of the image sensor creates a small dot cloud within the plane in accordance with FIGS. 3a and 3b. Each—infinitely small—dot within the dot cloud represents a measured value of the radiance for a specific viewing direction or lateral formation position within the respective focal-depth plane. The radiance between the dots may initially be assumed to be unknown.

The dot clouds of adjacent microlenses, which in FIGS. 3a and 3b with the borders 34 are indicated merely with regard to the outer dimensions, penetrate one another. The optics design of the microlens system may be configured such that the dots of the dot clouds do not coincide but are distributed within the plane as uniformly as possible, i.e. also within the area wherein the pixel dot subclouds of the individual channels mutually intersect, such an overlap area being indicated by 50 in FIG. 3b.

Subsequently, the interpolator 18 overlays the overall dot cloud thus obtained by a regular Cartesian grid 42, as was described above. The radiance present at the intersection dots of the Cartesian grid is determined, or interpolated, from the existing measured values. For example, for each intersection point, the n nearest neighbors may be determined; their radiance values are used for weighted averaging. The weighting, or the norm, of each pixel density value may be effected, e.g., with the inverse of the distance or the inverse of the square of the distance.

The nearest neighbors may be determined, e.g., by browsing all of the dots of the dot cloud. If the dots are divided into various areas, so-called bins, beforehand, this may accelerate the search. A faster alternative is to span a triangulation, ideally a Delaunay triangulation, between the pixels of the cloud. Finding the nearest neighbors of any dot in a Delaunay triangulation is comparatively fast. In particular, the following algorithm, described by a pseudocode, may be used for generating and interpolating the dot cloud.

```
// create dot cloud
for each color
    dot cloud (color).init( )
    for each micropicture
        for each pixel within the micropicture
            if (colorofPixel (pixel) = color)
                viewingDirection = calculateViewingVirectionofPixel
                    (microlens, positionInLens (pixel))
                dot cloud (color). Add (viewingDirection,
                    radianceOfPixel (pixel))
            end if
        end for
    end for
end for
// result: three picture clouds with radiance information
// interpolation
interpolatedPicture, init ( )
for each color
    for x = 0 up to pictureWidth
        for y = 0 up to pictureHeight
            neighbors = dotCloud (color) . findNearestNeighbor(x,y)
            for each neighbor in neighbors
                weight = calculateNorm (neighbor, x,y)
                interpolatedPicture(color, x,y) += weighting *
                    neighbor.radiance;
            end for
        end for
    end for
end for
// result: interpolated picture
```

Figure 7:
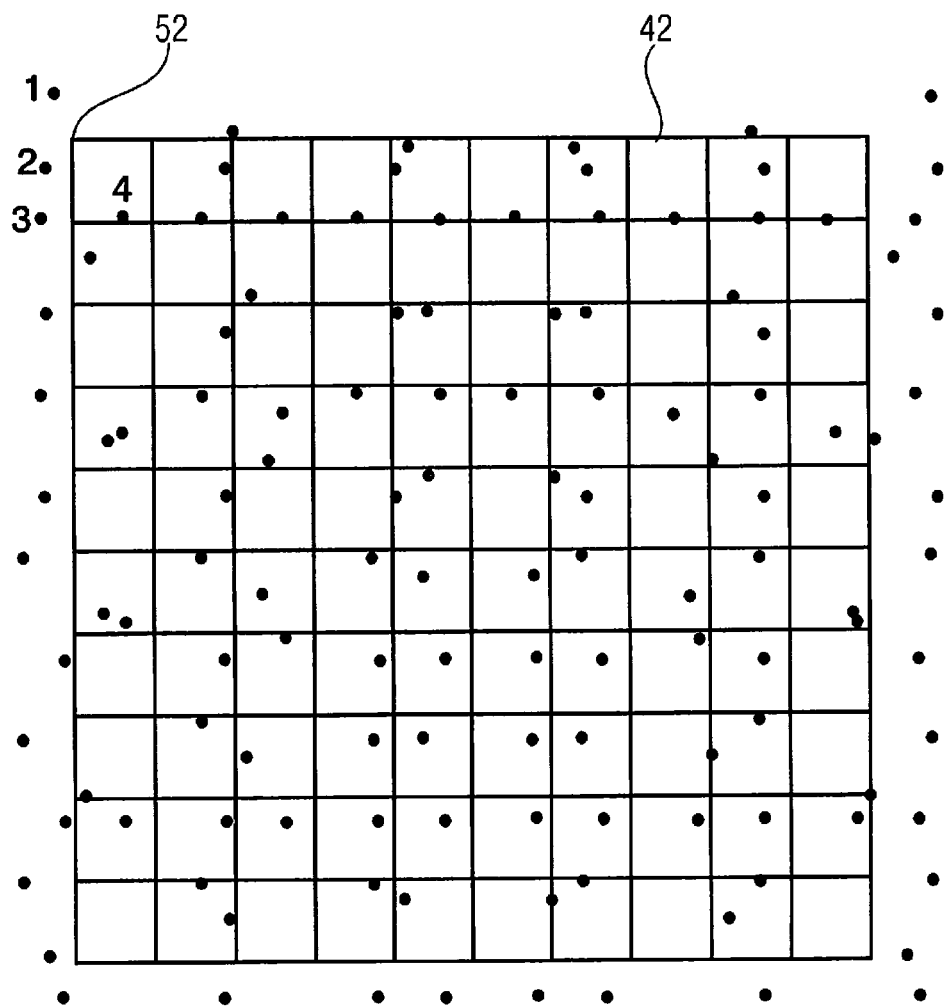
FIG. 7 shows a schematic view of a pixel dot cloud and of a superimposed regular grid in accordance with an embodiment.

To explain the above pseudocode, reference shall be briefly made, once again, to above figures in connection with FIG. 7. The first for loop in the dot cloud generation program code passes through the individual colors of the pixels. Thus, an overall cloud is produced for each color. The second for loop passes through all of the micropictures $24_1$-$24_3$. The third for loop, i.e. the innermost one, passes through all of the pixels 28 in the current micropicture $24_1$-$24_3$. By means of the innermost if query, a verification is made as to whether the pixel currently searched for has the current color. If this is the case, its viewing direction is calculated, specifically while using the reference to the respective channel and/or to the respective microlens and the pixel position within the micropicture, and the radiance of the pixel currently searched for is plotted at the corresponding location within the plane in accordance with FIG. 3a and/or 3b. In this exemplary case, the viewing direction, i.e. the plane in accordance with FIG. 3b, was used as the basis.

The second program section deals with the actual interpolation. The outermost for loop again passes through the individual colors. For each color, the regular Cartesian grid 42, namely its intersection points 52, is cycled through once. PictureWidth and pictureHeight thus indicate the picture height and the picture width of the desired overall picture that is to be output later on at the output 22. Following the corresponding two for loops, the neighbors are initially determined for this grid point 52. The four nearest neighbors of the intersection point 52, shown in FIG. 7 by way of example, of the grid 42 would be, for example, the pixels indicated by 1, 2, 3, and 4. The innermost for loop cycles through all of said nearest neighbor pixels, calculates, for each of said pixels, a weighting in accordance with a suitable distance norm from the current grid point 52, and forms a sum of the radiance of said pixel neighbors—said sum being weighted accordingly—in order to obtain interpolated values at the location of the current intersection point 52. In this manner, an interpolated value is determined for all of the intersection grid points 52, specifically for all of the colors, so that a multi-component color value results for each grid 42 for each grid intersection point 52.

A few alternatives to the previous description will be mentioned below. As was described above, each channel may be filtered individually. However, it is also possible for the image sensor 12 to be covered by a suitable color filter array, such as a Bayer pattern. In this manner, the spectral radiance of the overall picture may be measured for several, typically three wavelength bands. Naturally, the density of the measurement points within a single band decreases. In a Bayer pattern, it is divided by two for green, and by four for red and blue. As was described above, one dot cloud will then be created per color channel, for example. The green channel of the finished picture results from the corresponding interpolation in the green dot cloud. The same applies analogously to red and blue. Together the channels yield the finished color picture.

As an improvement it is possible that the measurement points from the green channel be used for interpolating the red and blue channels, and vice versa.

Figure 8A:
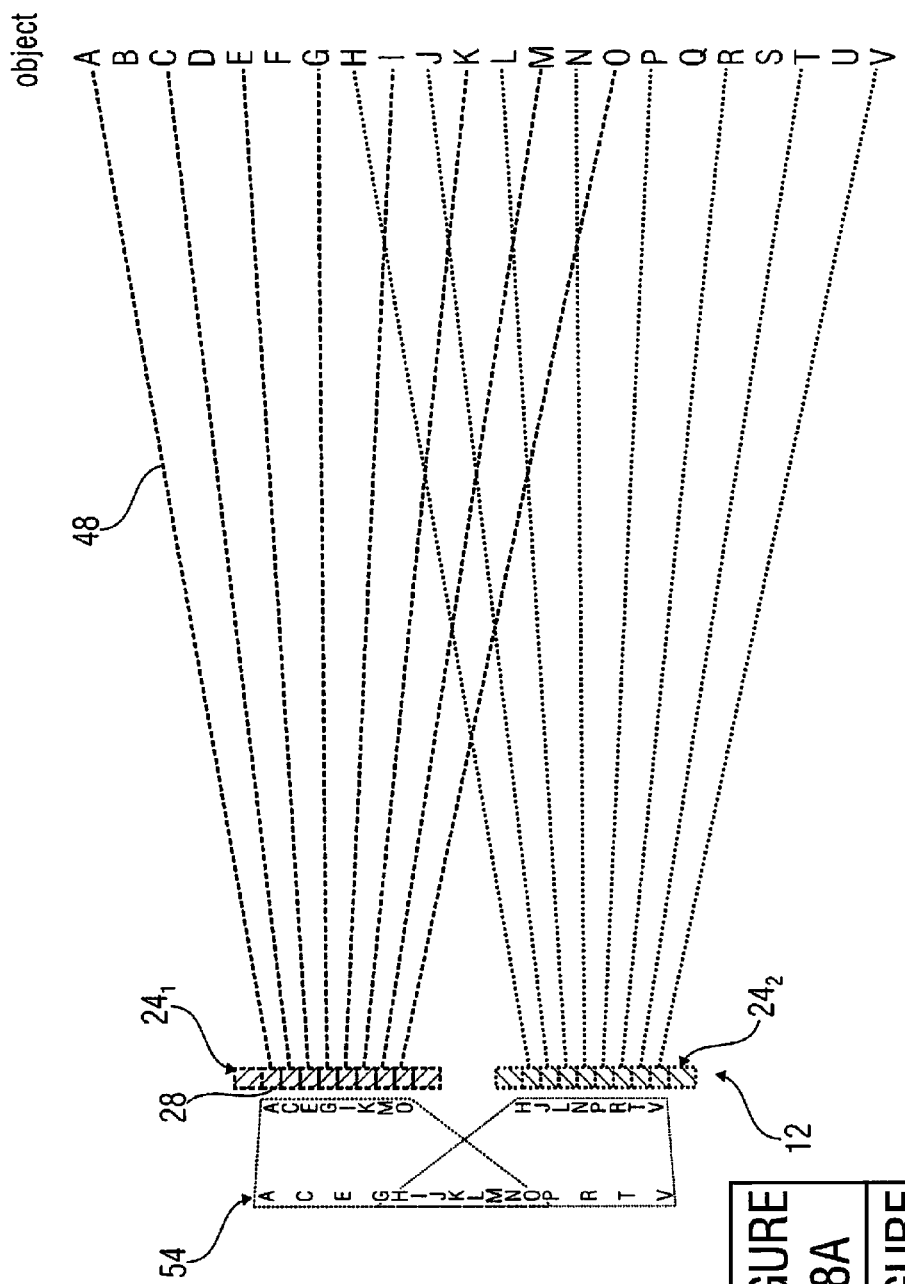
FIG. 8 shows a schematic drawing of two photographing situations for illustrating the error arising from erroneously ignoring the parallax effect.
Figure 8B:
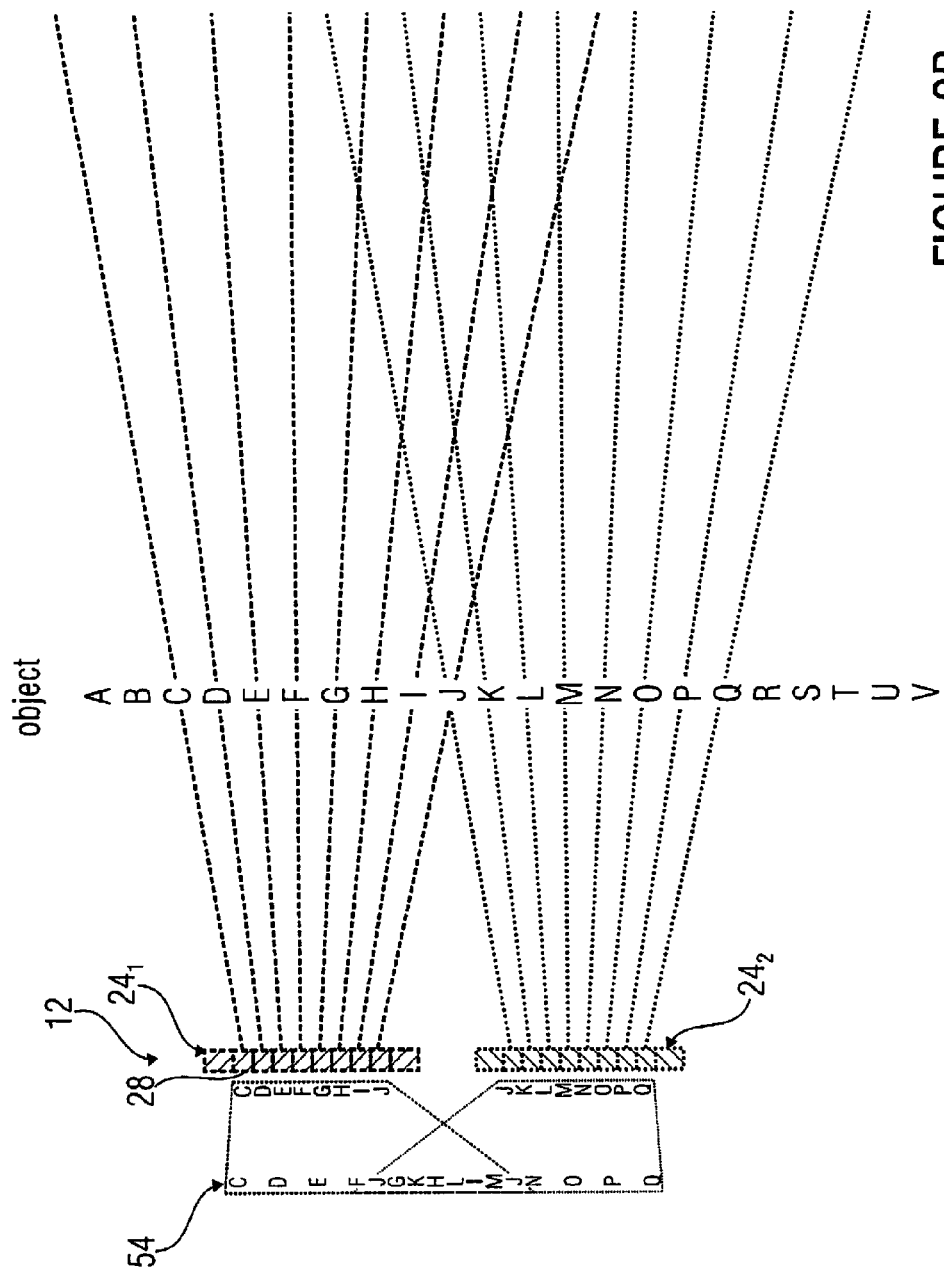

As was also already described above, parallax effects may be responsible for the fact that if the distance of the object to be imaged is not large in relation to the microlens repeat distance, the simplification no longer applies, according to which the parallax term is negligible. In addition to the viewing direction 48 of a pixel, its position on the image sensor is also relevant in this case. To illustrate this, reference shall briefly made to FIG. 8, which illustrates, at the top, the case where the object is correctly arranged at the far distance, i.e. the object is arranged sufficiently far away from the image sensor 12, and wherein it is also assumed that the object to be captured is located at said far distance, i.e. the association in accordance with FIG. 3b is used; the bottom part illustrates the case that the object is located to close, even though it is assumed that it is positioned at the far distance. 54 illustrates in each case how the sampled points A-V of the object are resorted, in the finished picture, at those locations where the object is hit by the viewing directions 48. As may be seen, the sequence of the points A-V on the object is maintained in case of correct positioning of the object in the finished picture, whereas the sequence of the object points gets mixed up in case of incorrect positioning, i.e. too close to the image sensor 12.

Thus, the interpolator 18 is able to compose a pleasing, high-resolution image without any discontinuities when above embodiments are employed. Measurement values of adjacent points on an object continue to be adjacent even in the finished picture as long as the picture capturing apparatus is used as specified and/or as long as above-mentioned adjustment possibilities are used. In yet other words, the object distance of an arrangement of the measurement points within the image plane may have to be taken into account. In the simplest case, a fixed object distance may be assumed. What is also feasible is a distance estimation and/or measurement and corresponding treatment of the measurement points, as was described above.

Above the description mainly referred to a picture capturing apparatus with enlargement of the field of view by means of subdivision into several channels that have smaller viewing angles and mutually overlap. The present application is also feasible for other applications wherein, for example, a scene is observed from different viewing angles with essentially overlapping single-channel fields of view.

Figure 4:
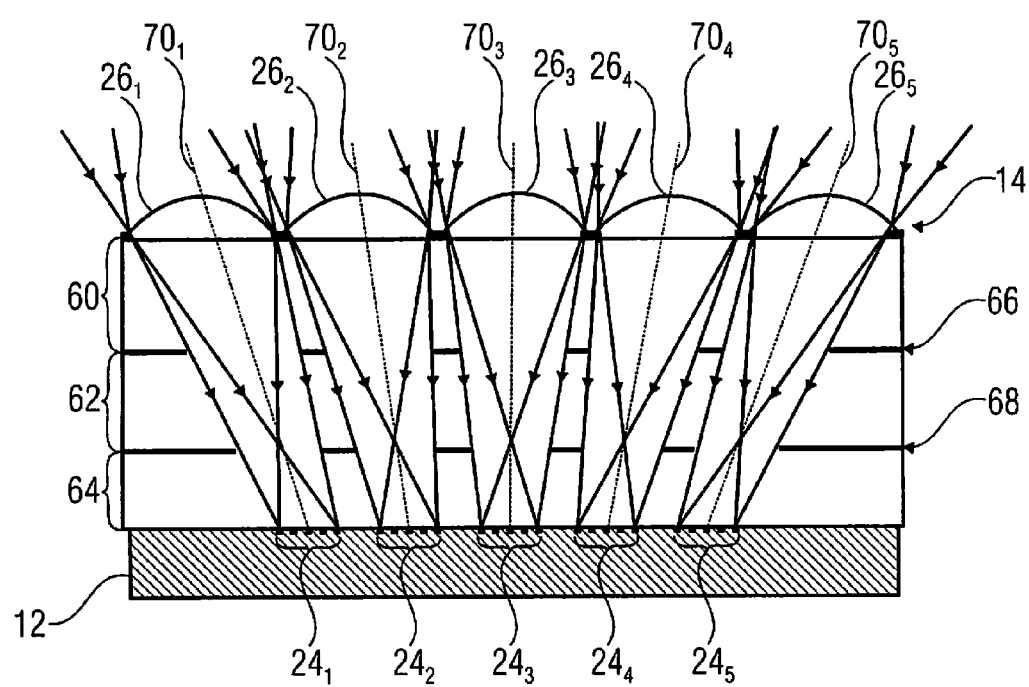
FIG. 4 shows a sectional view of an arrangement consisting of image sensor and microlens array in accordance with an embodiment.

In the above embodiments, the multi-channel optical element used may be a chirped microlens array, i.e. a microlens array whose lens vertices have lateral positions that are positioned in a dilated manner with regard to the central positions of the corresponding subareas, or are offset in a different way. By way of example, FIG. 4 shows a possible example of a fixed arrangement with a fixed distance between the image sensor 12 and the microlens array 14. The image sensor 12 is a CMOS-image sensor, for example, or any other semiconductor sensor. Several glass substrates 60, 62 and 64 with interposed membrane areas 66 and 68 for channel separation and stray light absorption are arranged on the substrate 12. The microlenses $26_1$-$26_5$ are formed on the topmost glass substrate 60. As may be seen, the vertex repeat distance of the microlenses is larger than the central repeat distance of the subareas $24_1$-$24_5$, which results in the enlargement of the overall field of view and/or the divergence of the central viewing directions $70_1$-$70_5$ of the individual channels. The example of a design in accordance with FIG. 4 may be produced, for example, in a wafer bond arrangement, namely with subsequent dicing of the individual cameras, i.e. the individual combinations of image sensor and microlens array.

Within the frame work of a plenoptic camera above embodiments may also be used in that a primary optical element is added to the microlens array in the embodiments shown above.

With regard to the above embodiments it shall also be noted that the channels of the microlens arrays shown above may be identical with one another or may be different, or chirped, in the lateral direction or across the field. In turn, a channel may be imaged by an individual lens, as is shown in FIG. 4 by way of example, or a lens system. Instead of a microlens array, it would also be possible to use a diaphragm array for imaging, or a combination of both. In both cases, one could determine the viewing direction of each pixel, so that it may be transferred into a dot cloud, on which the above-mentioned interpolation may be performed.

In above embodiments, inversion of the frames, equalization of same as well as a parallax correction are consequently inherently performed in one step, which accelerates processing. The picture information is combined to form an overall picture in one step, and intermediate interpolation steps are dispensed with, which again improves the quality of the overall picture, since the definition of the picture increases and artifacts are reduced. Above embodiments are suitable for sensors comprising filters. It would be possible to use a color filter array underneath each microlens, or to place a filter of precisely one color beneath each microlens. The last-mentioned filters may be RGB color filters, and it is also possible to use additional colors, such as RGB+grey or RGB+cyan. It is also possible to use polarization filters or grey and/or neutral density filters of various densities.

Therefore, it is possible to enable taking color pictures. In addition, it is possible to produce photographs of pictures with additional information, such as further spectral pictures in the areas of multi-spectral imaging, polarization information, larger dynamic range, etc.

By the above embodiments it also becomes possible to not only globally register the partial pictures with regard to one another, but to also register each pixel of the picture with regard to others. A distortion of the micropictures is inherently balanced off automatically. Various micropictures may thus also be distorted differently, which clearly reduces the requirements placed upon the optical system. The optical element 14 may be of simpler design and may be smaller/flatter, the manufacturing tolerances may be larger, and all of this consequently also reduces the manufacturing costs of the above embodiments and reduces the design size.

Above embodiments may be employed in camera systems in many fields of application, such as mobile phones, video conference systems, in the field of medical applications, in robotics, in machine-vision applications, in vehicle cameras and in remote sensing, specifically in the field of multi-spectral imaging. From the point of view of the system, the above embodiments are applicable with cameras having multi-aperture imaging systems and camera arrays, i.e. systems comprising several cameras. In other words, each of the above channels might obviously also be individually formed of a camera, in which case the above-mentioned image sensor 12 would break down into the individual chips of the cameras, each of which per se would form the subareas $24_1$-$4_3$, and the optical element 14 would break down into individual lenses of the cameras.

Even though some aspects were described in connection with an apparatus, it is to be understood that said aspects also represent a description of the corresponding method, so that a block or a component of an apparatus may also be understood as a corresponding method step or as a feature of a method step. By analogy therewith, aspects that were described in connection with or as a method step also represent a description of a corresponding block or detail or feature of a corresponding apparatus.

Depending on specific implementation requirements, embodiments of the invention may be implemented in hardware or in software. Implementation may be performed by using a digital storage medium, for example a floppy disc, a DVD, a Blu-ray disc, a CD, a ROM, a PROM, an EPROM, an EEPROM or a flash memory, a hard disc or any other magnetic or optical memory which has electronically readable control signals stored thereon that may cooperate, or actually cooperate, with a programmable computer system such that the respective method is performed. Therefore, the digital storage medium may be computer-readable. Some embodiments in accordance with the invention thus comprise a data carrier having electronically readable control signals that are capable of cooperating with a programmable computer system such that any of the methods described herein is performed.

Generally, embodiments of the present invention may be implemented as a computer program product having a program code, the program code being operative to perform any of the methods when the computer program product runs on a computer. The program code may also be stored, for example, on a machine-readable carrier.

Other embodiments comprise the computer program for performing any of the methods described herein, said computer program being stored on a machine-readable carrier.

In other words, an embodiment of the inventive method thus is a computer program having a program code for performing any of the methods described herein when the computer program runs on a computer. A further embodiment of the inventive methods thus is a data carrier (or a digital storage medium or a computer-readable medium) which has the computer program for performing any of the methods described herein stored thereon.

A further embodiment of the inventive method thus is a data stream or a sequence of signals representing the computer program for performing any of the methods described herein. The data stream or sequence of signals may be configured, for example, to be transferred via a data communication link, for example via the internet.

A further embodiment comprises a processing means, for example a computer or a programmable logic device configured or adapted to perform any of the methods described herein.

A further embodiment includes a computer which has the computer program for performing any of the methods described herein installed thereon.

In some embodiments, a programmable logic device (for example a field-programmable gate array, an FPGA) may be used for performing some or all of the functionalities of the methods described herein. In some embodiments, a field-programmable gate array may cooperate with a microprocessor for performing any of the methods described herein. Generally, in some embodiments the methods are performed by any hardware device. This may be a universally applicable hardware such as a computer processor (CPU) or a hardware specific to the method, for example an ASIC.

The above-described embodiments merely represent an illustration of the principles of the present invention. It is to be understood that modifications and variations of the arrangements and details described herein will be apparent to other persons skilled in the art. Therefore it is intended that the invention be limited only by the scope of the following claims rather than by the specific details presented herein by means of the description and the explanation of the embodiments.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A picture capturing apparatus comprising:
an image sensor comprising a multitude of pixels, said image sensor being configured to detect, in a photograph, a sample per pixel;
an optical element for producing optical imaging to the image sensor, the optical element comprising a multi-channel optical element for individually imaging overlapping solid-angle ranges to separate subareas of the image sensor, and wherein each pixel of the image sensor has an imaging value associated therewith, the imaging values being imaging directions from which the optical element images objects to the respective pixel, or lateral imaging positions within a focal-depth area that is imaged to the respective pixel by the optical element; and
an interpolator for interpolating a distribution of the samples of the pixels in accordance with their imaging values at intersection points of a regular grid that extends across the entire distribution of the samples in order to achieve an array of picture values.

2. The picture capturing apparatus as claimed in claim 1, wherein the multi-channel optical element is configured such that the overlapping solid-angle ranges together cover an overall solid-angle range that is 120% larger, at the most, than any of the overlapping solid-angle ranges.

3. The picture capturing apparatus as claimed in claim 1, wherein the multi-channel optical element is configured such that the overlapping solid-angle ranges together cover an overall solid-angle range that is at least four times larger than any of the overlapping solid-angle ranges.

4. The picture capturing apparatus as claimed in claim 1, wherein the optical element is configured such that the individual images are mutually different, but taken individually are spectrally, polarization, or neutral-density filtered in a laterally constant manner, the interpolator being configured to individually perform interpolation for a distribution of the samples of such pixels that belong to subareas wherein the respective individual imaging to same is filtered identically.

5. The picture capturing apparatus as claimed in claim 4, wherein the interpolator is configured to also take into account, in the individual interpolation of the distribution of the samples of such pixels that belong to subareas wherein the respective individual imaging to same is filtered identically, the distribution of samples of pixels that belong to subareas wherein the respective individual imaging to same is filtered differently.

6. The picture capturing apparatus as claimed in claim 4, wherein the interpolator is configured to use the same regular grid, in the same position, for the individual filtering operations.

7. The picture capturing apparatus as claimed in claim 1, wherein the pixels of the image sensor comprise pixel groups comprising mutually different spectral, polarization and/or neutral-density sensitivities, each subarea of the image sensor comprising at least pixels from two different pixel groups, and wherein the interpolator is configured to perform the interpolation individually for the pixel groups.

8. The picture capturing apparatus as claimed in claim 1, further comprising an associator configured to determine, for a predetermined pixel of the image sensor, the imaging value associated with the predetermined pixel by means of calculation using positional information with regard to the predetermined pixel on the image sensor or by means of lookup using a reference to the predetermined pixel.

9. The picture capturing apparatus as claimed in claim 8, further comprising an input interface and/or a distance estimator configured to distinguish, for the photograph, at least between a close-up shot and a long-distance shot, the associator being configured to perform, in the event of a close-up shot, the determination while taking into account parallax effects such that the imaging values are lateral imaging positions in the focal-depth area, and, in the event of a long-distance shot, to perform the determination while neglecting parallax effects, so that the imaging values are imaging directions.

10. The picture capturing apparatus as claimed in claim 8, further comprising an input interface and/or a distance estimator configured to determine, for the photograph, a shooting distance, the associator being configured to perform the determination in dependence on the shooting distance.

11. The picture capturing apparatus as claimed in claim 8, the picture capturing apparatus being configured such that a distortion of the optical element is balanced off by the association of the imaging values with the pixels in the array of picture values.

12. The picture capturing apparatus as claimed in claim 1, wherein the multi-channel optical element comprises a multitude of microlenses, and the association of a respective imaging value with each pixel of the image sensor is dependent on a direction of an optical axis of the microlenses of the multi-channel optical element, pixel coordinates of the pixels under the microlenses and a distortion of the microlenses.

13. The picture capturing apparatus as claimed in claim 1, wherein the interpolator is configured to find, for each intersection point, nearest neighbors among the distribution of samples and perform weighted averaging over the samples using a weighting that corresponds to the inverse of the distance or the inverse of the square of the distance between the respective intersection point and the imaging values associated with the nearest neighbors.

14. The picture capturing apparatus as claimed in claim 1, wherein the multi-channel optical element comprises an array of microlenses, and a distance of the optical element from the image sensor is equal or larger than a focal length of the microlenses, and wherein an average distance of vertices of the microlenses is enlarged as compared to a center-to-center distance of the subareas of the image sensor.

15. A method of capturing a picture by means of an image sensor comprising a multitude of pixels, said image sensor being configured to detect, in a photograph, a sample per pixel, and an optical element for creating optical imaging to the image sensor, the optical element comprising a multi-channel optical element for individually imaging overlapping solid-angle ranges to separate subareas of the image sensor, comprising associating an imaging value with each pixel of the image sensor, the imaging values being imaging directions from which the optical element images objects to the respective pixel, or lateral imaging positions in a focal-depth area that is imaged to the respective pixel by the optical element; and interpolating a distribution of the samples of the pixels in accordance with their imaging values at intersection points of a regular grid extending across the entire distribution of the samples so as to achieve an array of picture values.

16. A non-transitory computer-readable medium having stored thereon a computer program comprising a program code for performing the method of claim 15, when the program runs on a computer.

* * * * *